United States Patent
Ohnhauser et al.

(10) Patent No.: US 7,157,945 B2
(45) Date of Patent: Jan. 2, 2007

(54) WINDOW COMPARATOR AND METHOD OF PROVIDING A WINDOW COMPARATOR FUNCTION

(75) Inventors: Frank Ohnhauser, Stein (DE); Mikael Badenius, Adelsdorf (DE)

(73) Assignee: Texas Instruments Incorporated, Dallas, TX (US)

( * ) Notice: Subject to any disclaimer, the term of this patent is extended or adjusted under 35 U.S.C. 154(b) by 156 days.

(21) Appl. No.: 11/006,298

(22) Filed: Dec. 6, 2004

(65) Prior Publication Data

US 2006/0119400 A1 Jun. 8, 2006

(51) Int. Cl.
*H03K 5/22* (2006.01)
*H03K 5/153* (2006.01)
*H04Q 7/20* (2006.01)

(52) U.S. Cl. .................. 327/74; 327/553; 327/554; 455/307; 455/340

(58) Field of Classification Search ............... None
See application file for complete search history.

(56) References Cited

U.S. PATENT DOCUMENTS

| | | | | |
|---|---|---|---|---|
| 4,733,205 A | * | 3/1988 | Hughes | 333/172 |
| 5,914,633 A | * | 6/1999 | Comino et al. | 327/553 |
| 6,563,363 B1 | * | 5/2003 | Tay | 327/337 |
| 6,618,579 B1 | * | 9/2003 | Smith et al. | 455/307 |
| 6,628,163 B1 | * | 9/2003 | Dathe et al. | 327/553 |
| 6,677,814 B1 | * | 1/2004 | Low et al. | 327/554 |
| 7,050,781 B1 | * | 5/2006 | Khalil et al. | 455/340 |
| 2004/0000950 A1 | * | 1/2004 | Sjursen et al. | 330/279 |

FOREIGN PATENT DOCUMENTS

| JP | 58135969 A | 8/1983 |
|---|---|---|
| JP | 04098158 A | 3/1992 |

* cited by examiner

*Primary Examiner*—Rexford Barnie
*Assistant Examiner*—Dylan White
(74) *Attorney, Agent, or Firm*—W. James Brady, III; Frederick J. Telecky, Jr.

(57) ABSTRACT

A window comparator comprising a single comparator circuit that has a positive input, a differential negative input, and an output, wherein limits of a window are defined by a reference voltage and a window condition is defined for a differential voltage between a positive input voltage and a negative input voltage so that the differential voltage is within the limits of the window; including a common mode voltage, a first set of two switched capacitors connected to the positive comparator input, a second set of two switched capacitors connected to the negative comparator input, a switching array capable of assuming a plurality of different switching conditions, and detecting the output of the comparator in relation to the switching conditions of the switching array.

11 Claims, 3 Drawing Sheets

WINDOW COMPARATOR AND METHOD OF PROVIDING A WINDOW COMPARATOR FUNCTION

FIELD OF THE INVENTION

The present invention relates to a method of providing a window comparator function with a single comparator unit and to a window comparator comprising a single comparator circuit.

BACKGROUND OF THE INVENTION

A window comparator monitors an input voltage and provides a digital output which indicates whether the input voltage is within or without a pre-defined voltage window. For reasons of compatibility, the input voltage is normally a differential input voltage. The window comparator is quite difficult to implement in a standard analog circuitry. The differential input voltage has to be converted to a single ended signal using an instrumentation amplifier. The single ended signal needs to be compared with the reference voltage that sets the window width and also with the inverted reference voltage. This means an inverting amplifier and two comparators are also necessary to implement the window comparator. So, the conventional approach requires at least four units, i.e. level shifter, inverting amplifier, and two comparators, each of these units having an offset and a gain error. Because of the amount of involved circuitry, trimming or calibration is required to achieve the demanded accuracy.

The total sum of these errors causes a very loose specification for offset and hysteresis. In order to prevent oscillation at the output of the window comparator when the input voltage exceeds the limits of the predetermined window, a hysteresis must be added. But if a hysteresis is required, things get even more complicated.

SUMMARY OF THE INVENTION

The present invention provides a window comparator function with only a single comparator unit.

Specifically, the invention proposes a method of providing a window comparator function with a single comparator unit that has a positive input, a differential negative input and an output. Limits of a window are defined by a reference voltage and a window condition is defined for a differential voltage between a positive input voltage and a negative input voltage so that the differential voltage is within the limits of the window. The method according to the invention comprises the following steps:

providing a common mode voltage;
providing a first set of two switched capacitors, each of which has a first electrode connected to the positive input of the comparator unit;
providing a second set of two switched capacitors, each of which has a first electrode connected to the negative input of the comparator unit;
providing a switching array capable of assuming a plurality of different switching conditions;
switching the second electrode of the capacitors in the first set selectively between the positive input voltage, the reference voltage and zero voltage potential;
switching the second electrodes of the capacitors in the second set selectively between the negative input voltage and zero voltage potential; and
detecting the output of the comparator unit in relation to the switching condition of the switching array.

With this method, since only one comparator is required, the accuracy of the comparator function is significantly improved. The accuracy of the comparator function can be improved by a factor about 10 compared to a common window comparator. Other components which were required for the conventional window comparator are not needed any more with the method according to the invention, allowing a simplified design of a circuit for performing the proposed method.

In a further development of the invention, the plurality of switching conditions comprise a first switching condition wherein the first electrodes of the capacitors in the first set are both connected to the common mode voltage, the second electrodes of the capacitors in the first set are connected to the positive input voltage and to the reference voltage, respectively, and the second electrodes of the capacitors in the second set are connected to the negative input voltage and to zero voltage potential, respectively;

a second switching condition wherein the first electrodes of the capacitors in the first set are both disconnected from the common mode voltage, the second electrodes of the capacitors in the first set are both connected to the reference voltage and the second electrodes of the capacitors in the second set are both connected to zero voltage potential;

a third switching condition wherein the first electrodes of the capacitors in the first set are both disconnected from the common mode voltage, the second electrodes of the capacitors in the first set are both connected to zero voltage potential and the second electrodes of the capacitors in the second set are both connected to zero voltage potential.

With this method, one window comparator result can be received after only three clock cycles.

The invention further provides a window comparator comprising a single comparator circuit that has a positive input, a negative input and an output, wherein limits of a window are defined by a reference voltage and a window condition is defined for a differential voltage between a positive input voltage and a negative input voltage so that the differential voltage is within the limits of the window. The comparator comprises further a common mode voltage source, a first set of two switched capacitors, each of which has a first electrode connected to the positive input of the comparator circuit, and a second set of two switched capacitors, each of which has a first electrode connected to the negative input of the comparator circuit. A switching array capable of assuming a plurality of different switching conditions and means for switching the second electrodes of the capacitors in the first set selectively between the positive input voltage, the reference voltage and zero voltage potential are also provided, further, means for switching the second electrodes of the capacitors in the second set selectively between the negative input voltage and zero voltage potential and detecting means for detecting the output of the comparator unit in relation to the switching condition of the switching array. No trimming or calibration is required; therefore, the window comparator can easily be implemented. Since only a single comparator circuit is used, the window comparator can operate very efficiently at only low power. So, this window comparator is particularly suitable for mobile implementations such as automotive use.

BRIEF DESCRIPTION OF THE DRAWINGS

Further advantages and features of the invention will become apparent from the following detailed description with reference to the appending drawings. In the drawings.

DETAILED DESCRIPTION OF THE DRAWINGS

Figure 1:
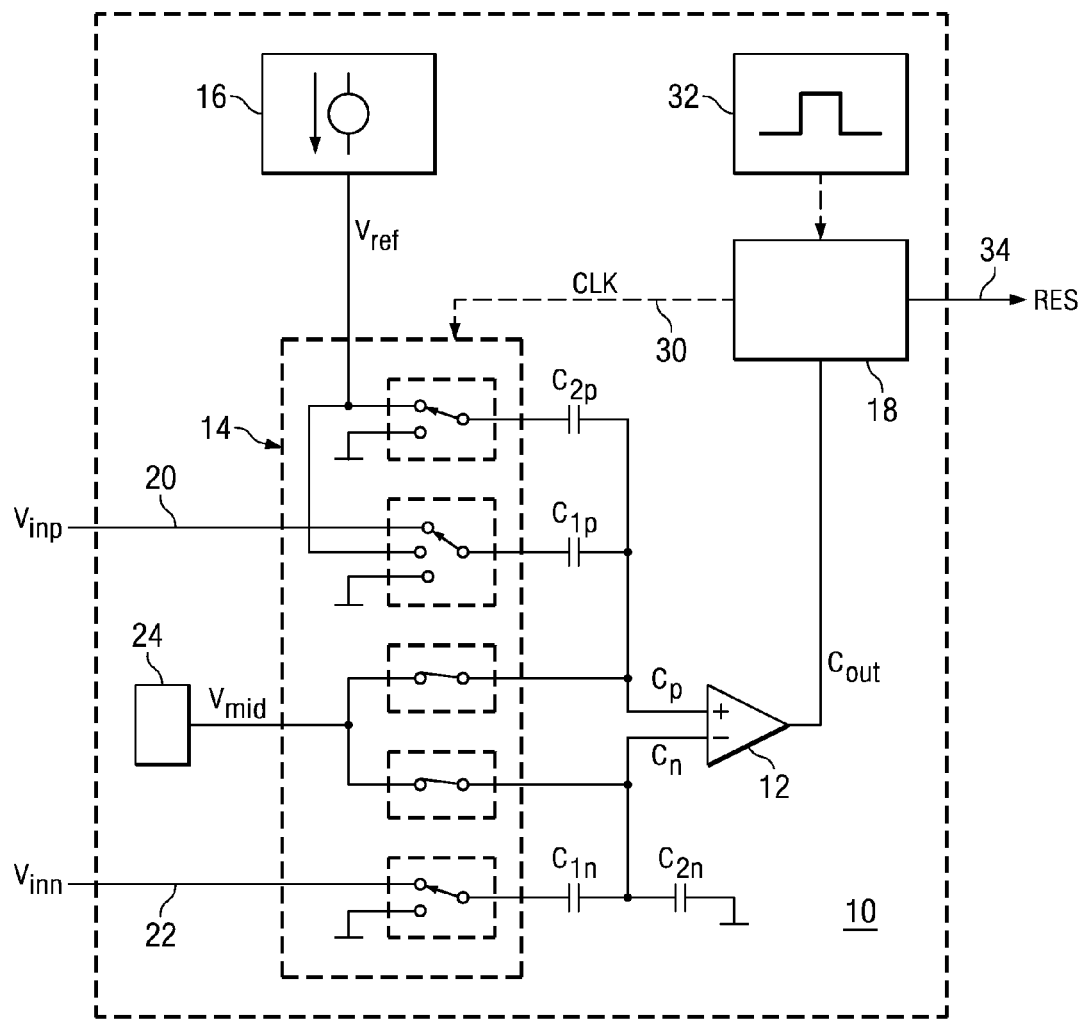
FIG. 1 shows a block diagram of a window comparator according to a first embodiment of the invention.

The block diagram of FIG. 1 shows a window comparator 10 comprising a comparator circuit 12, a switch array 14, a reference voltage source 16, and a control unit 18. The comparator circuit has a positive input $c_p$, a negative input $c_n$ and an output $c_{out}$. The inputs $c_p$ and $c_n$ are connected to the switching array 14, the design and function of which will be explained in detail below.

The switching array 14 is also connected to the reference voltage source 16 which provides a reference voltage $V_{ref}$, defining the width of the comparator window. Alternatively, an external reference voltage source can be used. The switching array 14 is further connected to input terminals 20, 22 for receiving a positive input voltage $V_{inp}$ and a negative input voltage $V_{inn}$, respectively, and to a common mode voltage source 24, providing a common mode voltage $V_{mid}$, e.g. a constant voltage which sets the bias point for the comparator circuit 12.

The control unit 18 is connected to the switching array 14 via a command line 30 for controlling the operation of the switching array 14. The control unit 18 is driven by a clock CLK from a clock generator 32. The control unit 18 is also connected to the output $c_{out}$ of the comparator circuit 12 for detecting the output of the comparator unit 12 in relation to the switching condition of the switching array 14. The control unit 18 finally has an output 34 connected to an output terminal 36 of the window comparator 10 for providing a resulting output signal res.

The window comparator 10 further comprises a plurality of capacitors, including a first set of two capacitors $C_{1p}$, $C_{2p}$, each of which has a first electrode connected to the positive input $c_p$ of the comparator circuit 12, and a second set of two capacitors $C_{1n}$, $C_{2n}$, each of which has a first electrode connected to the negative input $c_n$ of the comparator circuit 12. The capacitors $C_{1p}$, $C_{2p}$, $C_{1n}$ have their second electrodes connected to the switching array 14 while capacitor $C_{2n}$ has its second electrode permanently connected to zero voltage potential. Preferably all capacitors are of the same capacity to avoid asymmetries.

Figure 6:
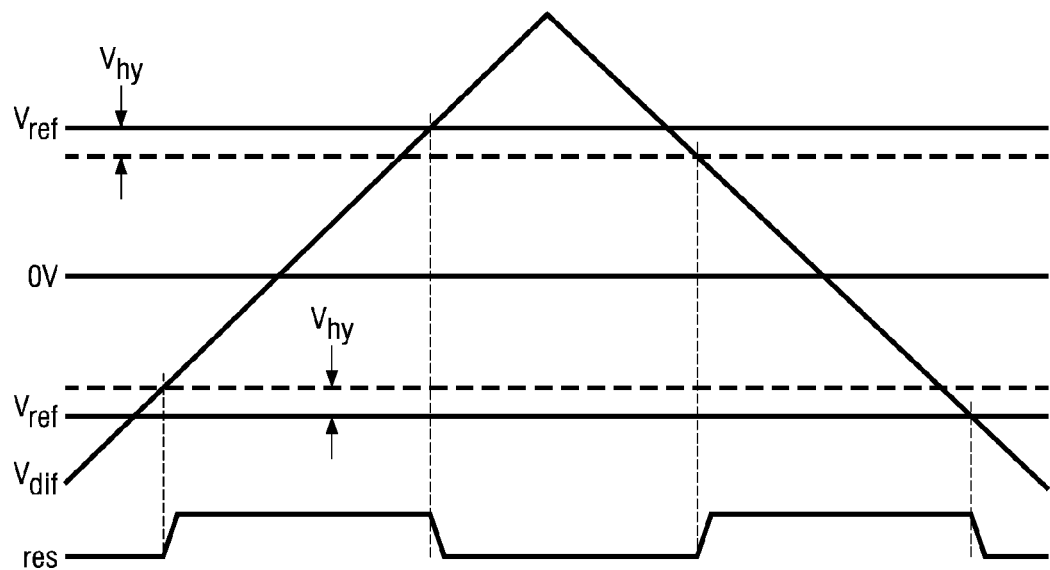
FIG. 6 shows a diagram illustrating the input and output signals of a window comparator.

FIG. 6 shows a typical transfer function of the window comparator. The comparator output res is high if the differential input voltage $V_{dif}$ is within the limits $-V_{ref}$, $V_{ref}$ defining the width of the comparator window. To prevent the comparator from toggling at high frequency when the input voltage is near one of the limits, a hysteresis $V_{hy}$ can be added.

The operation of the window comparator 10 will now be explained in detail referring to FIGS. 2 through 4. These Figures show schematically the window comparator 10 with the switching array 14 being in three different switching conditions. These switching conditions relate to three clock cycles of the control unit 18, which are necessary to receive one window comparator result.

Figure 2:
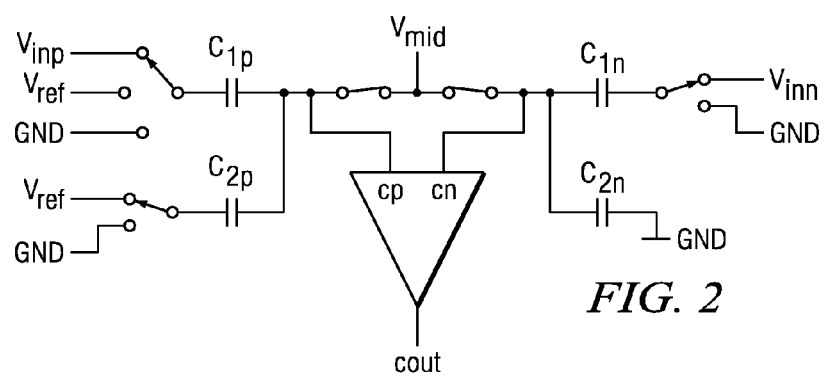
FIGS. 2–4 show schematics for illustrating the function of the window comparator from FIG. 1 in four different states.

Referring now to FIG. 2, the switching array 14 is in a first switching condition in which the capacitors $C_{1p}$ and $C_{1n}$ are connected to the differential analog input voltages $V_{inp}$ and $V_{inn}$, respectively on one side and to a common mode voltage $V_{mid}$ on the other side, which side is also connected to the comparator inputs $c_p$ and $c_n$. In this state, an offset occurring at the comparator output $c_{out}$ can be compensated. Capacitor $C_{2n}$ is always connected to the comparator circuit input $c_n$ on one side and to a zero voltage potential (0V) on the other side, while capacitor $C_{2p}$ is connected to comparator circuit input $c_p$ on one side and to the reference voltage $V_{ref}$ on the other side. So, during the first clock cycle, which will be called the sampling clock cycle, each capacitor is charged by the voltage it is connected to. Therefore, the charges at the inputs $c_p$ and $c_n$ can be calculated to:

$$Q_{s,cp}=C_{1p}(V_{inp}-V_{mid})+C_{2p}(V_{ref}-V_{mid})=C(V_{inp}+V_{ref}-2V_{mid})$$

for $c_p$ and $$Q_{s,cn}=C_{1n}(V_{inn}-V_{mid})+C_{2n}(0-V_{mid})=C(V_{inn}-2V_{mid})$$

for $c_n$.

Figure 3:
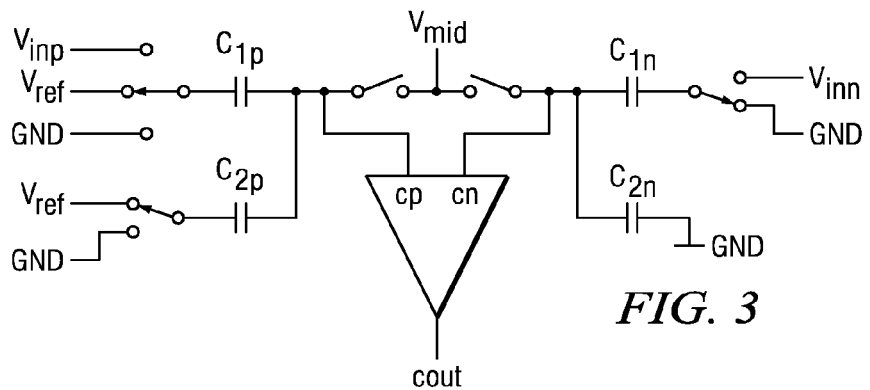

At the beginning of the second clock cycle, which is a first measurement cycle, the charges get frozen when the control unit 18 is driving the switching array 14 into a second switching condition which is shown in FIG. 3. In this second switching condition the inputs $c_p$ and $c_n$ of the comparator circuit 12 and the capacitors connected thereto are disconnected from the common mode voltage $V_{mid}$. Also, the capacitor $C_{1n}$ is disconnected from the negative input voltage $V_{inn}$ and connected to 0V. So, the charge on the negative input $c_n$ of the comparator circuit 12 during this first measurement cycle is:

$$Q_{c(1),cn}=C_{1n}(0-cn)+C_{2n}(0-cn)=C(0-2cn)$$

As the charge is frozen, $Q_{c1,cn}$ is equal to $Q_{s,cn}$ and therefore:

$$cn = V_{mid} - \frac{V_{inn}}{2}.$$

The second switching condition of switching array 14 also has the capacitor $C_{1p}$ disconnected from the positive input voltage $V_{inp}$ and connected to the reference voltage $V_{ref}$. Therefore, the charge on the positive node can be calculated to:

$$Q_{c(1),cp}=C_{1p}(\text{ref}-cp)+C_{2p}(\text{ref}-cp)=C(2\text{ref}-2cp)$$

this charge has also been frozen and therefore $Q_{c1,cp}$ is equal to $Q_{s,cp}$:

$$cp_{(1)} = V_{mid} - \frac{V_{inp-ref}}{2}$$

The output $c_{out}$ of the comparator circuit 12 will be high ($C_{out}=1$) if $c_{p(1)} \geq c_n$, and therefore:

$$V_{ref} \geq V_{inp} - V_{inn}$$

which means that the comparator output $c_{out}$ is high when the differential input voltage remains below the reference voltage $V_{ref}$.

In the first measurement clock cycle, the control unit 18 can only decide whether the differential input voltage is higher than the positive reference voltage. But if the differential input voltage is negative, i.e. $V_{inp}-V_{inn}<0$, then it can be below the lower limit of the comparator window, which is defined by the inverse of the reference voltage $-V_{ref}$. Therefore, a second measurement needs to be done during a third clock cycle.

Figure 4:
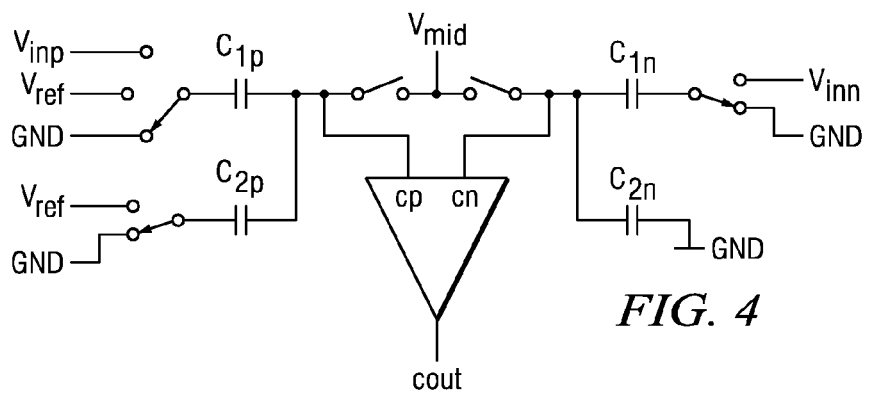

FIG. 4 shows the third switching condition of the switching array 14 during this third clock cycle, the second measurement clock cycle. The capacitors $C_{1p}$ and $C_{2p}$ are disconnected from the reference voltage $V_{ref}$ and connected to 0V. Therefore, charges on these capacitors are now referenced to 0V, and:

$$Q_{c(2),cp}=C_{1p}(0-cp)+C_{2p}(0-cp)=C(0-2cp)$$

which is again equal to $Q_{s,cp}$, so $$Cp_{(2)} = V_{mid} - \frac{V_{imp+ref}}{2}.$$

Since the comparator circuit output $c_{out}$ is high if $c_{p(2)} \geq c_n$ $$-\text{ref} \geq V_{inp}-V_{inn}$$

which means that the output of the comparator circuit is high ($C_{out}=1$) if the differential input voltage is lower than the inverted reference voltage $V_{-ref}$.

Based on these measurements during clock cycles 2 and 3, the control unit 18 is able to detect whether the differential input voltage $V_{inp}-V_{inn}$ is within the comparator window, which means within the range $V_{-ref}$ to $V_{ref}$, if $c_{out(1)}=1$ and $c_{out(2)}=0$.

The clock cycles 1 through 3 are repeated sequentially, therefore the measurement is repeated every three clock cycles. The control unit 18 can be driven by an internal clock from clock generator 32 or alternatively from a clock provided externally.

Figure 5:
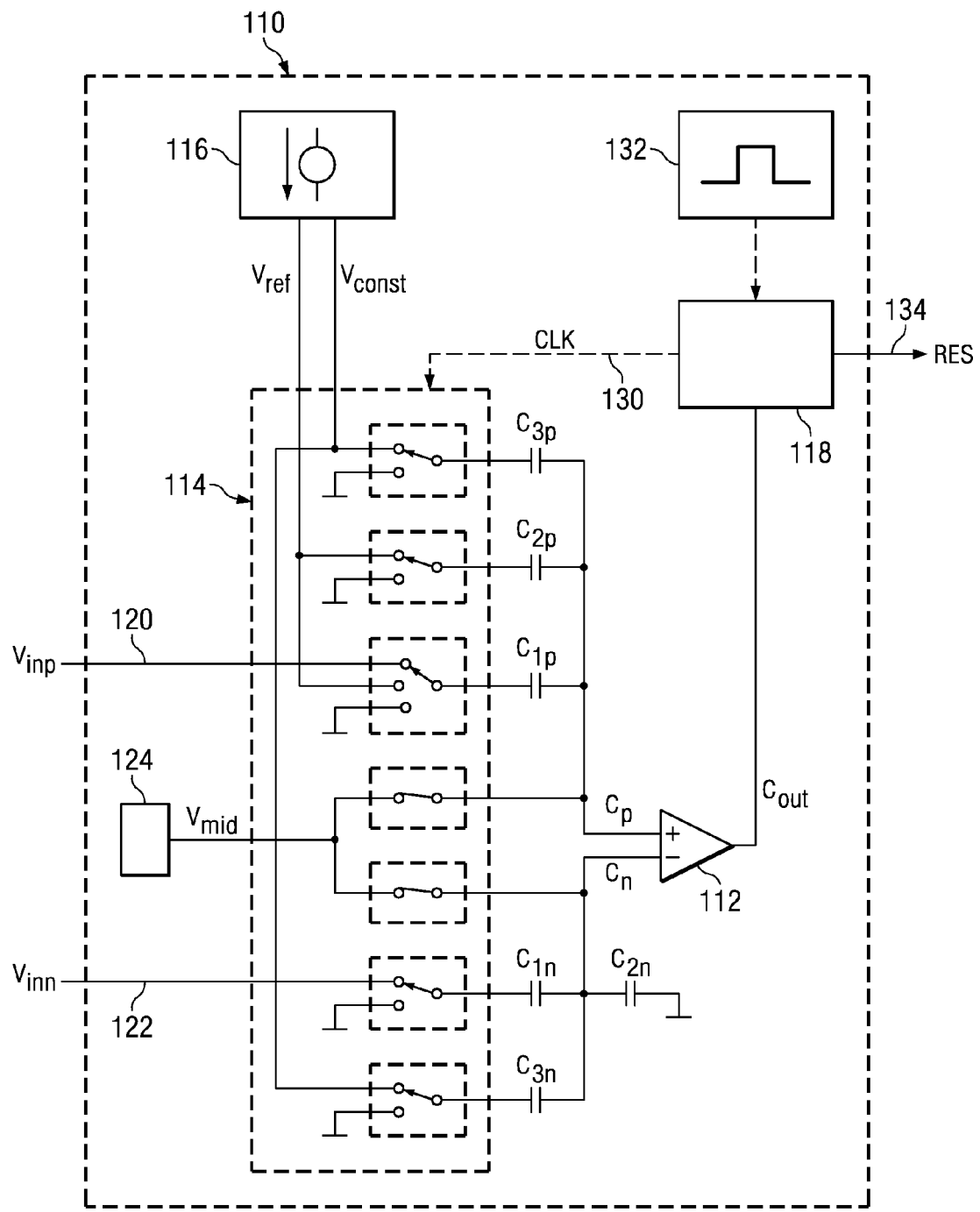
FIG. 5 shows a block diagram for a window comparator according to a second embodiment of the invention.

A second embodiment of the invention, which is shown in FIG. 5, introduces a hysteresis $V_{hy}$ to prevent a high frequency toggling of the comparator output 36 should the absolute differential input voltage be equal to the reference voltage. In the switched capacitor approach of this invention, the hysteresis is not essential any more, since the output is digital and updated every three clock cycles, but it is very easy to implement.

To provide a hysteresis, the window comparator 110 of FIG. 5 comprises in addition two capacitors $C_{3p}$ and $C_{3n}$ that have one end connected to the positive input $c_p$ and the negative input $c_n$ of the comparator circuit 112, respectively. The capacity of these hysteresis capacitors $C_{3p}$ and $C_{3n}$ is small compared to the other capacitors. The other end of these capacitors $C_{3p}$ and $C_{3n}$ is toggled by the switching array 114 between 0V and constant voltage $V_{const}$ which defines the hysteresis width.

The toggling of the switching array 114 is controlled by the control unit 118 depending on the state of the comparator circuit output $c_{out}$. If the differential input voltage is within the comparator window, the switches of the array 114 keep the other sides of capacitors $C_{3p}$ and $C_{3n}$ to 0V. Therefore, they do not influence the equations given above. If the differential input voltage is not within the comparator window ($V_{inp}-V_{inn}>V_{ref}$ or $V_{inp}-V_{inn}<V_{-ref}$), the capacitors $C_{3p}$ and $C_{3n}$ are switched to the constant voltage $V_{const}$ which defines the hysteresis width. Thus:

$$\text{ref}-V_{hy} \geq V_{inp}-V_{inn}$$

and $$-(\text{ref}-V_{hy}) \geq V_{inp}-V_{inn}.$$

This means that the upper and the lower limits of the comparator window are shifted towards the middle of the window, effectively reducing the width of the comparator window.

The invention claimed is:

1. A method of providing a window comparator function with a single comparator unit that has a positive input ($c_p$), a differential negative input $c_n$ and an output ($c_{out}$), wherein limits of a window are defined by a reference voltage ($V_{ref}$) and a window condition is defined for a differential voltage between a positive input voltage ($V_{inp}$) and a negative input voltage ($V_{inn}$) so that the differential voltage is within the limits of the window, comprising the steps of:
   a) providing a common mode voltage ($V_{mid}$);
   b) providing a first set of two switched capacitors ($C_{1p}$, $C_{2p}$) each of which has a first electrode connected to the positive input ($c_p$) of the comparator unit;
   c) providing a second set of two switched capacitors ($C_{1n}$, $C_{2n}$) each of which has a first electrode connected to the negative input ($c_n$) of the comparator unit;
   d) providing a switching array capable of assuming a plurality of different switching conditions;
   e) switching the second electrodes of the capacitors ($C_{1p}$, $C_{2p}$) in the first set selectively between the positive input voltage ($V_{inp}$), the reference voltage ($V_{ref}$) and zero voltage potential (0V);
   f) switching the second electrodes of the capacitors ($C_{1n}$, $C_{2n}$) in the second set selectively between the negative input voltage ($V_{inn}$) and zero voltage (0V); and
   g) detecting the output ($c_{out}$) of the comparator unit in relation to the switching condition of the switching array.

2. The method of claim 1, wherein the capacitors in the first and second set are all provided with the same capacitance.

3. The method of claim 1, wherein the plurality of switching conditions comprise:
   a first switching condition wherein the first electrodes of the capacitors ($C_{1p}$, $C_{2p}$) in the first set are both connected to the common mode voltage ($V_{mid}$), the second electrodes of the capacitors ($C_{1p}$, $C_{2p}$) in the first set are connected to the positive input voltage ($V_{inp}$) and to the reference voltage ($V_{ref}$), respectively, and the second electrodes of the capacitors ($C_{1n}$, $C_{2n}$) in the second set are connected to the negative input voltage ($V_{inn}$) and to zero voltage potential (0V), respectively;
   a second switching condition wherein the first electrodes of the capacitors ($C_{1p}$, $C_{2p}$) in the first set are both disconnected from the common mode voltage ($V_{mid}$), the second electrodes of the capacitors ($C_{1p}$, $C_{2p}$) in the first set are both connected to the reference voltage ref and the second electrodes of the capacitors ($C_{1n}$, $C_{2n}$) in the second set are both connected to zero voltage potential (0V); and
   a third switching condition wherein the first electrodes of the capacitors ($C_{1p}$, $C_{2p}$) in the first set are both disconnected from the common mode voltage ($V_{mid}$), the second electrodes of the capacitors ($C_{1p}$, $C_{2p}$) in the first set are both connected to zero voltage potential (0V) and the second electrodes of the capacitors ($C_{1n}$, $C_{2n}$) in the second set are both connected to zero voltage potential (0V).

4. The method according to claim 3, comprising the step of deciding that the differential input voltage is within the window limits when the output ($c_{out(1)}$) of the comparator unit in the second switching condition is in a first condition and the output ($c_{out(2)}$) of the comparator unit in the third switching condition is in a second condition opposite to the first condition.

5. The method of claim 3, wherein the first through third switching conditions are cycled through continuously.

6. The method of claim 5, wherein a clock signal is used to cycle through the switching conditions.

7. The method according to claim 1, wherein the first and second sets of capacitors each comprise a third capacitor ($C_{3p}$, $C_{3n}$) having a first electrode connected to the first electrodes of the capacitors in the same set and a second electrode connected to zero voltage potential (0V) when the differential input voltage is within the window limits and to a constant voltage ($V_{const}$) when the differential input voltage is outside of the window limits.

8. A window comparator (10) comprising a single comparator circuit (12) that has a positive input ($c_p$), a differential negative input ($c_n$) and an output ($c_{out}$), wherein limits of a window are defined by a reference voltage ($V_{ref}$) and a window condition is defined for a differential voltage between a positive input voltage ($V_{inp}$) and a negative input voltage ($V_{inn}$) so that the differential voltage is within the limits of the window, comprising:
  i. a common mode voltage source (24);
  ii. a first set of two switched capacitors ($C_{1p}$, $C_{2p}$) each of which has a first electrode connected to the positive input ($c_p$) of the comparator circuit (12);
  iii. a second set of two switched capacitors ($C_{1n}$, $C_{2n}$) each of which has a first electrode connected to the negative input ($c_n$) of the comparator circuit (12);
  iv. a switching array (14) capable of assuming a plurality of different switching conditions;
  v. means for switching the second electrodes of the capacitors ($C_{1p}$, $C_{2p}$) in the first set selectively between the positive input voltage ($V_{inp}$), the reference voltage ($V_{ref}$) and zero voltage potential (0V);
  vi. means for switching the second electrodes of the capacitors ($C_{1n}$, $C_{2n}$) in the second set selectively between the negative input voltage ($V_{inn}$) and zero voltage potential; and
  vii. detecting means (18) for detecting the output ($c_{out}$) of the comparator unit (12) in relation to the switching condition of the switching array.

9. The window comparator of claim 8, comprising a clock generator (32) for controlling the switching array.

10. The window comparator according to claim 8, comprising a constant voltage source (16), wherein the first and second sets of capacitors each comprise a third capacitor ($C_{3p}$, $C_{3n}$) having a first electrode connected to the first electrodes of the capacitors in the same set and a second electrode connected to zero voltage potential (0V) when the differential input voltage is within the window limits and to the constant voltage ($V_{const}$) when the differential input voltage is outside of the window limits.

11. The window comparator of claim 10, wherein the third capacitor ($C_{3p}$, $C_{3n}$) in each set has a capacitance which is small in comparison to the capacitance of other capacitors in the same set.

* * * * *